United States Patent [19]
Maeda et al.

[11] Patent Number: 6,019,837
[45] Date of Patent: Feb. 1, 2000

[54] DETECTING METHOD OF IMPURITY CONCENTRATION IN CRYSTAL, METHOD FOR PRODUCING SINGLE CRYSTAL AND APPARATUS FOR THE PULL-UP OF A SINGLE CRYSTAL

[75] Inventors: Susumu Maeda, Hiratsuka; Keisei Abe, Chiyoda-ku; Kazutaka Terashima, Ebina; Hideo Nakanishi, Shinjuku-ku, all of Japan

[73] Assignees: Komatsu Electronic Metals Co., Ltd., Hiratsuka; Mitsubishi Materials Silicon Corporation, Tokyo; Kagaku Gijutsu Sinkou Jigyo Dan, Kawaguchi; Toshiba Ceramics Co., Ltd., Tokyo, all of Japan

[21] Appl. No.: 08/978,282

[22] Filed: Nov. 25, 1997

[30] Foreign Application Priority Data

Apr. 22, 1997 [JP] Japan ................................ 9-118835

[51] Int. Cl.$^7$ ................................................ C30B 15/20
[52] U.S. Cl. ................................ 117/14; 117/15; 117/30; 117/32; 117/917
[58] Field of Search .................... 117/14, 15, 28, 117/30, 32, 917

[56] References Cited

U.S. PATENT DOCUMENTS

| 4,496,424 | 1/1985 | Terashima et al. | 117/15 |
| 4,794,086 | 12/1988 | Kasper et al. | 436/36 |
| 5,349,921 | 9/1994 | Barraclough et al. | 117/13 |
| 5,524,574 | 6/1996 | Huang et al. | 117/20 |

FOREIGN PATENT DOCUMENTS

| 0 696 652 A2 | 2/1996 | European Pat. Off. |
| 1 228 406 | 4/1971 | United Kingdom. |

*Primary Examiner*—Felisa Hiteshew
*Attorney, Agent, or Firm*—Oliff & Berridge, PLC

[57] ABSTRACT

A temperature sensor 42 is provided in a furnace 11, measuring temperature above a molten liquid 24 put in a crucible 12 to check proceedings of evaporation of oxygen vaporized from a free surface 44 of the molten liquid 24. From the data, and considering the relation with the oxygen dissolved into the crucible 12, the oxygen concentration in the molten liquid 24 can be found and the amount of oxygen taken into a single silicon crystal 40 pulled up from the molten liquid 24 can be figured out.

9 Claims, 8 Drawing Sheets

F I G. 1
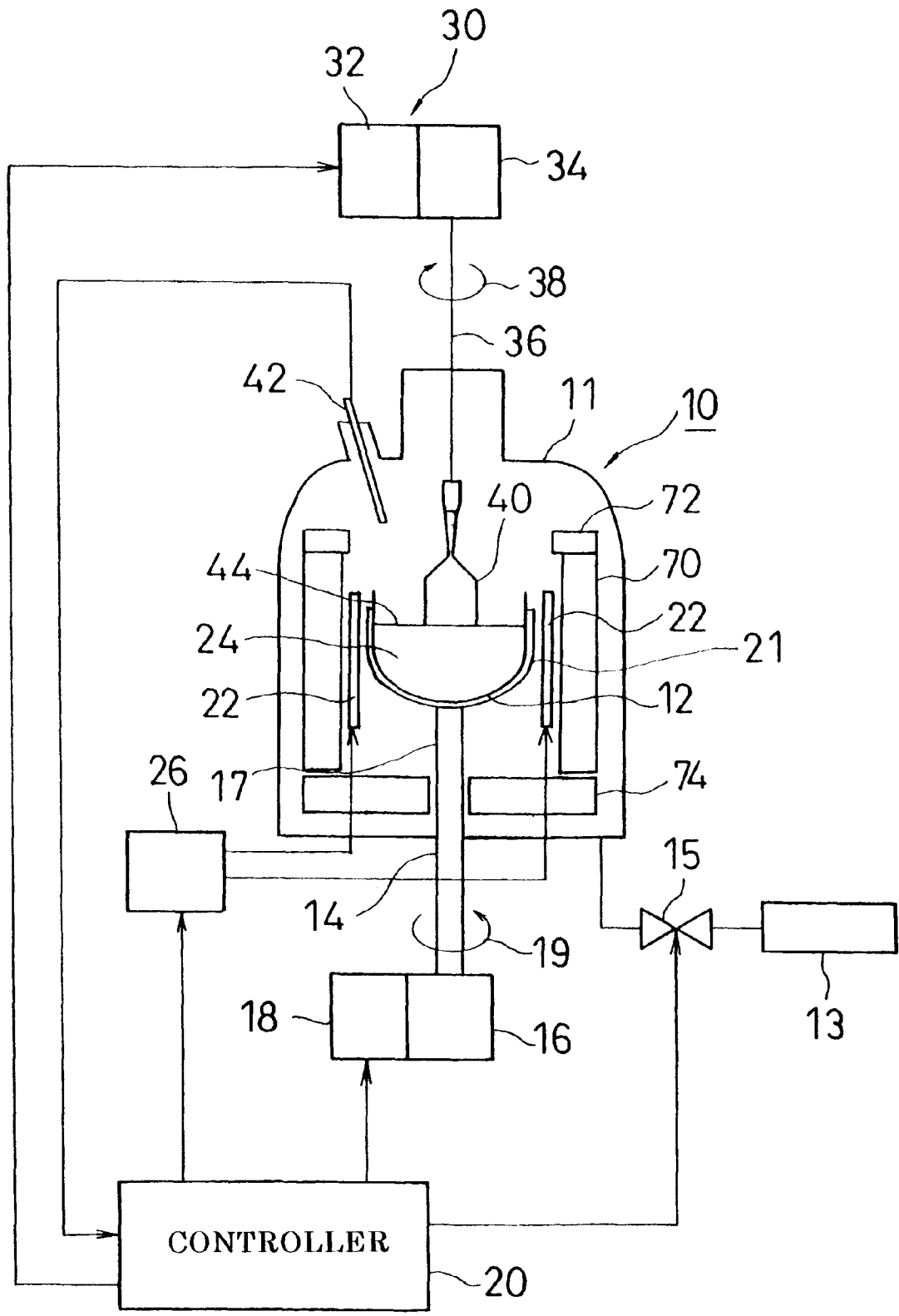

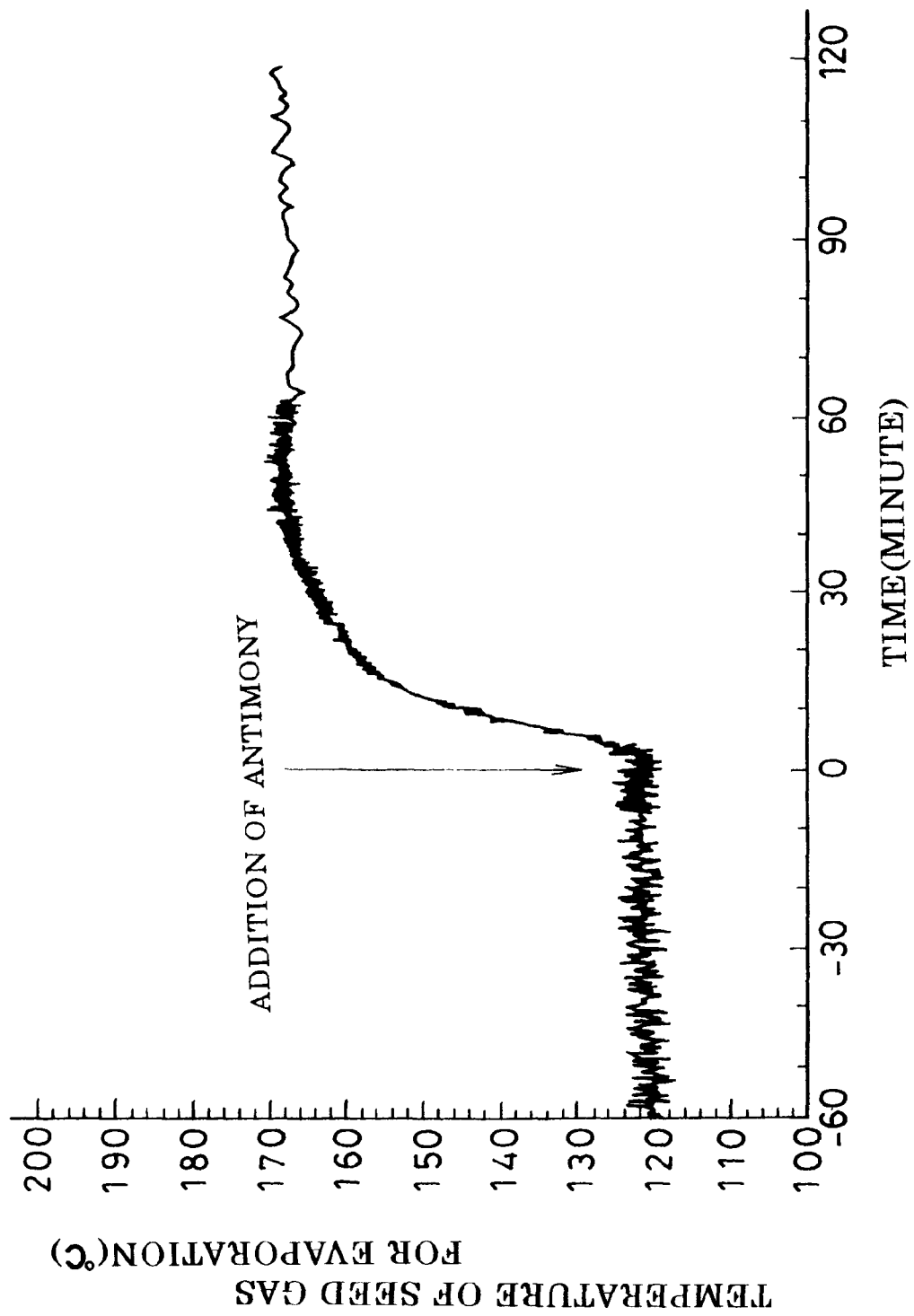

DETECTING METHOD OF IMPURITY CONCENTRATION IN CRYSTAL, METHOD FOR PRODUCING SINGLE CRYSTAL AND APPARATUS FOR THE PULL-UP OF A SINGLE CRYSTAL

BACKGROUND OF THE INVENTION

1. Field of the Invention

The present invention relates to a method for detecting the concentration of an impurity in a crystal grown out from a molten liquid in a crucible and a production method of a single crystal, particularly the detecting method of impurity concentration in a single semiconductor crystal such as silicon, the production method and the pulling up apparatus for the single silicon crystal.

2. Description of the Related Art

A single crystal of silicon used in an instrument using a semiconductor is, in general, made through the pull method (CZ method), the floating zone melting method (FZ method) or the method of pulling up the crystal under a magnetic field (MCZ method). The CZ method and MCZ method are to melt a high purity polycrystalline silicon in a quartz crucible and pull up a growing single silicon crystal from a molten silicon liquid. Therefore, oxygen enters the molten silicon liquid through dissolving $SiO_2$ from the quartz crucible. The oxygen thus entered is transferred to just below the crystal, diffusing along the flow of the molten liquid or diffusing through in the molten liquid and caught in the single crystal penetrating through a growing interface of the crystal.

An ingot of the single silicon crystal obtained by the CZ method and the like is sliced into thin wafers. The oxygen caught in the crystal changes the electrical resistance of the wafer, so the wafer having a required electrical resistance can not be obtained. The oxygen in the crystal may cause degradation of a wafer due to precipitation of oxides during high temperature processing of the silicon wafer. On the contrary, the oxygen caught in the crystal increases the crystal strength, blocking dislocation movement to increase so-called adherence strength, and also has a merit to reduce the deformation of the wafer (warp) resulting from heat processing. The oxygen in the crystal is also applied to intrinsic gettering for trapping the impurity in the crystal to the outside of the elemental area (device forming area).

A surface layer of the silicon wafer is used as a device forming area to form a device and the existence of impurity gives a device unfavorable effects. Therefore it is necessary to eliminate the impurity in the device forming area by some means. So an oxidized precipitate caused by oxygen in the crystal is precipitated below the device forming area through heat processing of the silicon wafer and the impurities such as heavy metals are caught by the precipitates so that the impurities can not move into the device forming area by means of so called intrinsic gettering and the pure device forming area can be obtained.

The intrinsic gettering by oxidized precipitates requires a precise control of oxygen content in the crystal and a uniform distribution of the oxygen. Moreover, the heat processing to separate the oxidized precipitates differs according to each semiconductor maker and the contents and sizes of the oxidized precipitates required by these makers are different with each other. So the wafer maker is required to meet the requirement from customers on the oxygen content in the crystal. Accordingly, it is very important for the production of a single silicon crystal to check the oxygen concentration in the molten liquid which pulls up the single crystal and to control the amount of oxygen taken into the crystal.

Most oxygen dissolved in the molten silicon liquid from a quartz crucible is known to evaporate as silicon oxides from the free surface of the molten liquid into the furnace atmosphere (in most cases in argon (Ar)). Then, oxygen concentration in the single silicon crystal is determined by the way of distribution of the oxygen whose amount is the subtraction of evaporation amount from dissolved amount from the quartz crucible, in the molten liquid inside the quartz crucible. Particularly it is determined by the oxygen distribution pattern in the growing interface of the crystal and the concentration level. And the oxygen distribution pattern in the growing interface of the crystal greatly affects the distribution of the oxygen concentration in the surface orthogonal to the axis of the single crystal ingot, and the concentration level greatly affects the height of oxygen concentration.

But it is impossible, at present, to directly control the amount of oxygen caught in the crystal while pulling up the crystal. Therefore, oxygen concentration control in a single silicon crystal by current CZ method is controlled by adjusting the oxygen distribution pattern just below the growing interface and the concentration level with changing the transportation style of oxygen by flow of the molten liquid using the following items as a parameter. The items used as a parameter are a heating value of the heater, number of revolution of the crucible, number of revolution of the crystal and furthermore, so called H/Z structure such as shape and size of the heater or the heat insulator and position of the heater, and in the MCZ method, these items and pattern and strength of the magnet field being applied. And it is reported that in the free surface of the molten liquid, the oxygen concentration becomes lower due to evaporation of the silicon oxides, the molten liquid in the low oxygen content free surface lowers the oxygen concentration at ends of the crystal, crawling underneath the crystal growing interface and makes the distribution of oxygen concentration in the wafer surface uneven.

But the method to control the oxygen concentration in the crystal by changing the flow of the molten liquid has been empirically carried out to a great extent from experience due to the difficulty of detecting the flow of the molten liquid and not to directly control the amount of oxygen caught in the crystal. Besides, the conventional oxygen control method is not clear on the extent of influence of the molten liquid flow upon the oxygen concentration in the crystal so the precise concentration control has been difficult.

On the contrary, dopant is added into molten silicon liquid to control electrical resistant rate of the single silicon crystal, this dopant also evaporates from the free surface of the molten liquid as oxides or silicide, the distribution pattern and the level of concentration of the dopant directly below the growing interface change in accordance with the flow of the molten liquid or diffusion. Then, same as in the case of oxygen above described, the distribution pattern and concentration level of the dopant directly below the growing interface is adjusted, using the flow of the molten liquid as a parameter, electric resistance of the crystal is controlled. But as described before, the method of controlling the flow of the molten liquid is difficult for making the electric resistance of the crystal as predetermined because the dopant concentration in the crystal can not be controlled precisely. As a result, the resistance distribution in the surface orthogonal to the axis of the crystal which is pulled up or the resistance level along the axis of the crystal are greatly changed and a wafer having a uniform quality can not be obtained.

SUMMARY OF THE INVENTION

The present invention is to overcome disadvantages of the conventional art described above and aims at detecting the amount of impurities in the crystal.

The present invention also aims at controlling the amount of impurities caught in the crystal.

According to the detecting method for impurity concentration in the crystal that relates to the present invention, the impurity concentration in the molten liquid can be known by detecting the amount of evaporation of oxygen or dopant from the molten liquid, and then the amount of impurity caught from the molten liquid in the crystal which precipitates from the molten liquid, in other words, the concentration of impurity in the crystal can be known.

According to the production method of a single crystal relating to the present invention, the amount of impurity (the concentration of the impurity) existing in the molten liquid changes according to the impurity in proceeding of evaporation such as oxygen and dopant from the molten liquid. Therefore by changing the flow of the molten liquid through changing at least any one of the following items, the heating value of the heater to heat the molten liquid, the number of revolutions of the crucible, the number of revolutions of the single crystal, the H/Z structure in accordance with the figures of evaporation of the impurity or by adjusting the amount of evaporation of the impurity through changing the pressure in the furnace in which the crucible is placed, the amount of the impurity caught in the single crystal pulled up from the molten liquid can be controlled, a single crystal having a required oxygen concentration or dopant concentration can be obtained and a single crystal of a uniform quality having a required oxygen concentration and resistance can be obtained. Incidentally, in the MCZ method which carries out the pulling up of the crystal with applying magnetic field to the molten liquid, pattern of the magnetic field or strength of the magnetic field in addition to other factors above described may be changed according to the figures of evaporation of the impurities.

BRIEF DESCRIPTION OF THE DRAWINGS

FIG. 1 is an explanatory view of the pull up apparatus of a single crystal relating to a first embodiment of the present invention;

FIG. 4 is a view showing temperature changes in the atmosphere of the upper portion of the molten liquid when antimony is added to the molten silicon liquid;

DETAILED DESCRIPTION OF THE PREFERRED EMBODIMENT(S)

Figure 2:
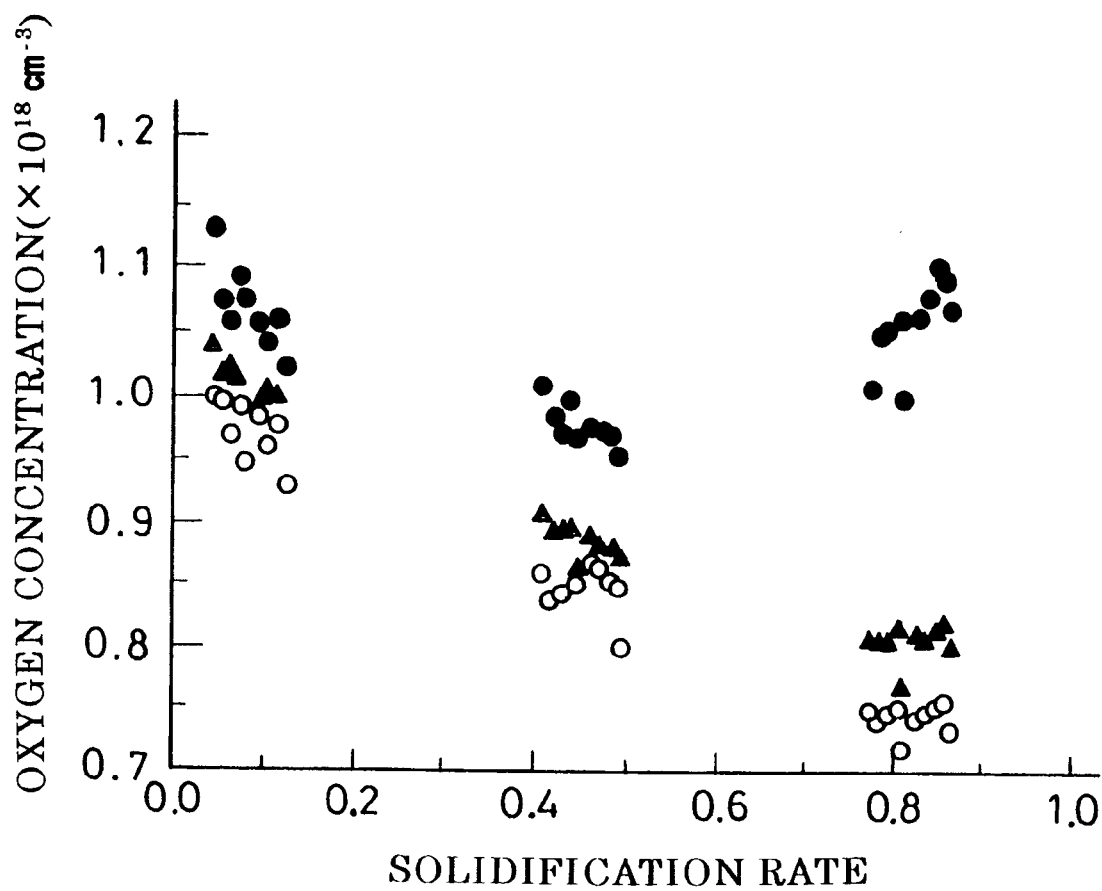
FIG. 2 is a view showing the relationship between rotational speed of the crucible and oxygen concentration in the single silicon crystal.

In a pull up process of a single silicon crystal, once an evaporation phenomenon (kind of evaporating material, amount of evaporation) of silicon oxide and dopant oxide from a free surface of a molten liquid is known, the amount of oxygen or dopant which is evaporating from the free surface of the molten liquid can always be grasped. So, by detecting the figures of evaporation of the impurity, the concentration of impurities such as oxygen and departs existing in the molten liquid is ascertained, the amount of oxygen or dopant caught in the single crystal can be quantitatively estimated and thus obtained oxygen concentration in the single crystal and the electric resistance of the single crystal can be precisely controlled.

The present invention is based on the above consideration. The detecting method of impurity concentration in the crystal relating to the present invention has a configuration that it detects the figures of evaporation of the impurity from the molten liquid placed inside the furnace and finds the concentration of the impurity in the crystal deposited from the molten liquid. The figures of evaporation of the impurity can be detected by checking at least any one of the following factors of the amount of evaporation of the impurity, the temperature at the upper portion of the molten liquid, or the pressure inside the furnace. And when the crystal is a single semiconductor crystal, the impurity is oxygen or dopant which controls electric resistance of the single semiconductor crystal.

In the production method of a single crystal, in which a growing single crystal is pulled up from a molten liquid in a crucible placed inside a furnace, the method relating to the present invention has a configuration that the figures of impurity evaporation from the molten liquid is detected, and according to the figures of the impurity evaporation thus detected, at least one of the following factors of a heating value of the heater for the molten liquid, the number of revolutions of the crucible, the number of revolutions of the single crystal, the H/Z structure, or the pressure inside the furnace is changed, in the production method of a single crystal. When the single crystal is produced by the MCZ method, at least one of the following factors of a heating value of the heater for the molten liquid, the number of revolutions of the crucible, the number of revolutions of the single crystal, the H/Z structure, the pressure inside the furnace, or the pattern or strength of the magnet field applied is changed according to the figures of the impurity. And the figures of the impurity evaporation can be detected by checking at least any one of the following factors of the amount of evaporation of the impurity, the temperature at the upper portion of the molten liquid, or the pressure inside the furnace. And when the single crystal is a single semiconductor crystal, the impurity is oxygen or dopant which controls electric resistance of the single semiconductor crystal.

In a pulling up apparatus of a single crystal, which pulls up a single crystal while growing from a molten liquid in a crucible placed inside a furnace, the pulling up apparatus of the single crystal relating to the present invention is composed of a valve controlling the pressure inside the furnace, a heater for the molten liquid, a motor rotating the crucible, a pulling up unit to pull up the crystal in rotating, an evaporation detecting member to detect at least any one of the following factors of the amount of evaporation of the impurity from the crucible placed inside the furnace, the temperature of the upper portion of the molten liquid, or the pressure inside the furnace, and a controller to change at least any one of the following factors of the opening angles of the valve, the heating value of the heater, the rotational speed of the motor, or the rotational speed or pull up speed of the pulling up unit, according to the signal of the evaporation detecting member. When the single crystal is produced by the MCZ method, the controller may be constructed to change at least any one of the heating value of the heater for the molten liquid, the number of revolutions of the crucible, the number of revolutions of the single crystal, the H/Z structure, the pressure inside the furnace, or the pattern or the strength of the magnetic field according to the figures of evaporation of the impurity.

The higher the temperature of the molten liquid, and the lower the pressure inside the furnace, the impurity such as oxygen or dopant in the molten liquid is caught less in the crystal. Using thus constructed detecting method of impurity concentration in the crystal relating to the present invention, by detecting the figures of impurity evaporation such as oxygen and dopant from the molten liquid, the concentration of the impurity existing in the molten liquid can be known based on the relation obtained in advance between the heating value, the pressure inside the furnace, the number of revolutions of the crucible, the number of revolutions of the single crystal, the H/Z structure that controls the temperature of the molten liquid and the concentration of the impurity in the molten liquid or in the crystal deposited from the molten liquid, and consequently the amount of the impurity caught in the crystal deposited from the molten liquid, or the concentration of the impurity in the crystal can be found.

According to the production method of the single crystal, thus configured, relating to the present invention, as the amount of the impurity (concentration of the impurity) in the molten liquid is changed according to the figures of evaporation of the impurity such as oxygen and dopant from the molten liquid, the amount of the impurity caught in the single crystal pulled up from the molten liquid can be controlled by changing the flow of the molten liquid in accordance with the figures of the impurity evaporation through changing at least any one of the following factors of the heating value of the heater heating the molten liquid, the number of revolutions of the crucible, the number of revolutions of the single crystal, and the H/Z structure, or through changing the pressure inside the furnace placing the crucible, a single crystal having a required oxygen concentration or dopant concentration can be obtained, and a single crystal of an uniform quality having a designated oxygen concentration and resistance. Incidentally, in the MCZ method which pulls up the crystal with a magnetic field applying to the molten liquid, the pattern and strength of the magnetic field may be changed in addition to these described above according to the figures of evaporation of the impurity.

The preferred embodiment of the detecting method of impurity concentration in the crystal, the production method of the single crystal and the pulling up apparatus of the single crystal relating to the present invention will be explained in detail according to the attached drawings.

FIG. 1 is an explanatory view of a pulling up apparatus of a single crystal relating to a first embodiment of the present invention, an explanatory view of the pulling up apparatus of the single crystal by the CZ method.

In FIG. 1, the pulling up apparatus of the single crystal 10 has a furnace 11 consisting of a vacuum vessel, provided with a crucible 12 made of quartz at the center of the furnace 11. The crucible 12 is held in a carbon crucible 19 supported by a carbon shaft (pedestal) 17 which is provided on the upper portion of a rotating shaft 14. The furnace 11 is connected with a vacuum pump 13 through a valve 15 so that the furnace 11 is kept under a designated pressure by exhausting air inside the furnace 11 with the vacuum pump 13. The rotating shaft 14 which rotates the crucible 12 is connected with a reduction gear 16 at the bottom end of the shaft 14 projecting downward of the furnace 11 so that it can rotate the crucible 12 toward the arrow direction 19, receiving a rotational driving force from the motor 18 through the reduction gear 16. The rotational speed of the driving motor 18 is controlled by a controller 20.

A heater 22 is provided in the surrounding of the crucible 12 so that it heats a molten liquid 24 which is a molten polycrystalline silicon in the crucible 12. The heater 22 is connected to a transformer 26 controlled by the controller 20 so that it can change the heating value. The controller 20 can also control a pulling up unit 30. The pulling up unit 30 has a pull up motor 32 and a reduction gear 34 to which a pull up shaft 36 is connected so that the pull up shaft 36 can pull up a single silicon crystal 40 in growing from the molten liquid 24 while rotating in the opposite direction of the crucible 12 as shown by an arrow 38. A temperature sensor 42 consisting of a thermocouple and the like which is an evaporation detector is arranged in the furnace 11 above the crucible 12 so that the temperature at the upper portion of the molten liquid 24 can be measured. And inside the furnace 11, a heat insulator 70 placed around the outer periphery of the heater 22, a top heat insulator 72 placed above the crucible 12, and a bottom heat insulator 74 placed below the crucible 12 are provided.

In the pulling up apparatus of the single crystal 10 thus constructed, quartz constituting the crucible 12 is dissolved in the molten liquid 24, as described before, increases the amount of oxygen which is an impurity in the molten liquid 24. And the oxygen dissolved in the molten liquid 24 changes into a seed gas for evaporation such as $SiO_2$, evaporating from a free surface 44 of the molten liquid 24 and a part of the oxygen is caught in the single crystal 40. The amount of oxygen caught in the single crystal 40 has a dependence on the amount of evaporation from the molten liquid 24. On the other hand, when the amount of evaporation of the seed gas for evaporation from the molten liquid 24 increases, the temperature above the molten liquid rises. So, for controlling the oxygen concentration in the single crystal 40, the relations among the temperature above the molten liquid, the amount of evaporation from the molten liquid 24, and the concentration of oxygen in the single crystal are sought in advance through experiment and the like. Moreover, when the heating value of the heater 22, the number of revolutions of the crucible 12, the number of revolutions of the single crystal, the speed of pulling up, the pressure inside the furnace 11 and so on are changed, the amount of evaporation of oxygen from the free surface 44 is also changed, affecting the amount of oxygen caught in the single silicon crystal 40.

For instance, adjusting the condition that inside the furnace 11 is filled with argon (Ar) under the pressure of 20 torr, the number of revolutions of the single crystal 40 by the pulling up unit 30 is 15 rpm, the pull up speed of the single crystal is 1.5 mm/min., the crucible 12 is rotated in the opposite direction of the single crystal 40 and the single silicon crystal of 6 inches diameter is pulled up while changing the rotational speed. The oxygen concentration caught in the single silicon crystal 40 is measured on the above described situation, which is shown in FIG. 2.

In FIG. 2, the horizontal axis represents a ratio of the single crystal 40 in the molten liquid 24 inside the crucible 12, in other words, a solidification rate, having no unit. The vertical axis represents oxygen concentration (number of atoms) in the single silicon crystal, having a unit of $10^{18}$ $cm^{-3}$. $\bigcirc$, $\blacktriangle$, $\bullet$ express the number of revolution of the crucible 12, ○ symbolizes 5 rpm, ▲ is for 10 rpm, and ● is for 15 rpm. As is clear from FIG. 2, the oxygen concentration in the single silicon crystal 40 is found to become higher with increase of the rotational speed of the crucible 12, during all stages of crystal growing, from the beginning of crystal growing of the solidification rate less than 0.1, at a mid-term of the solidification rate exceeding 0.4, and at the last stage of crystal growing of the solidification rate about 0.8. Incidentally, the oxygen concentration is measured through a Fourier transform infrared microscope (FT-IR).

Figure 3:
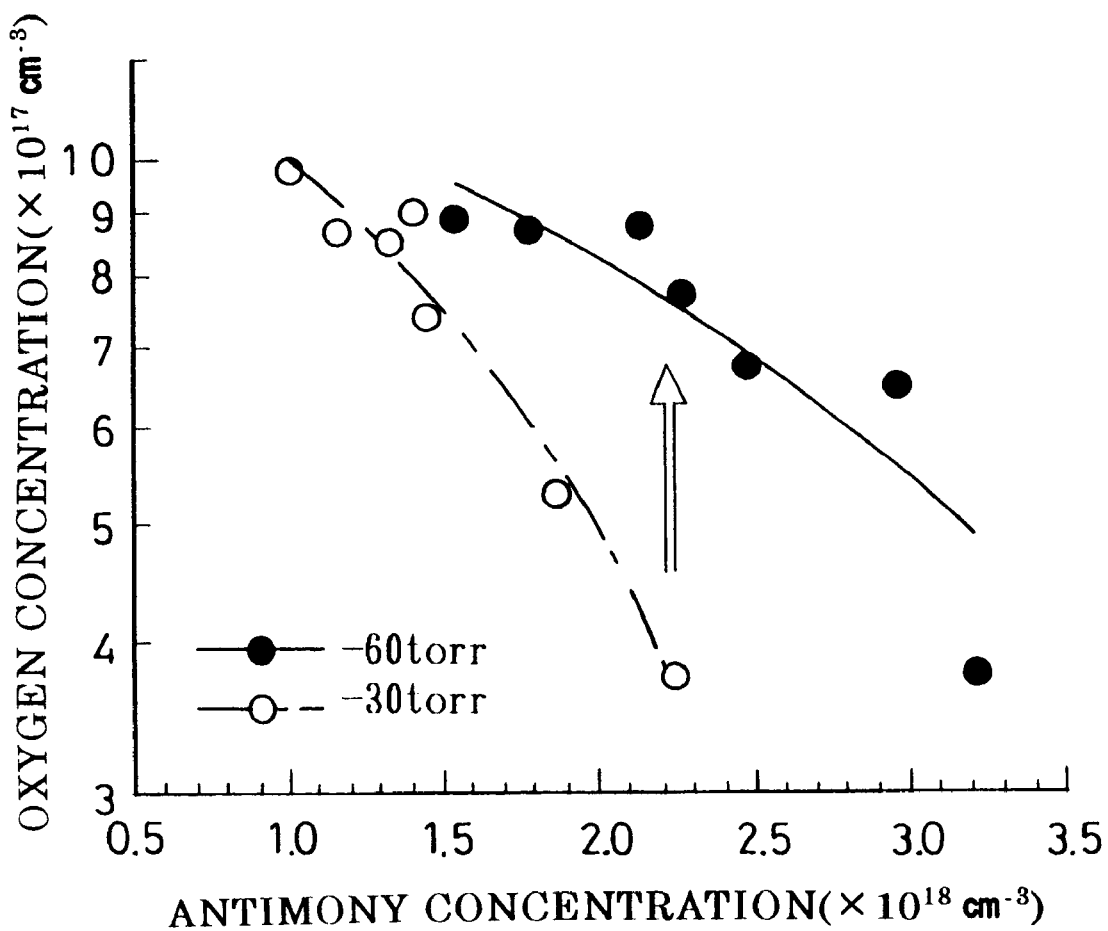
FIG. 3 is an explanatory view of the relationship between pressure inside the furnace and oxygen concentration in the single silicon crystal.

It is also known that the amount of oxygen caught in the single crystal 40 increases when the pressure inside the furnace 11 becomes higher. FIG. 3 shows an experimental result to study an effect of pressure inside the furnace 11 on the oxygen concentration (number of atoms) in the single silicon crystal when antimony (Sb) which is dopant to make a n-type semiconductor from the single crystal 40 is added to the molten liquid 24 (Ko Shin Mei "Research on oxygen behavior in an antimony added molten silicon liquid". In the figure, the horizontal axis is concentration of antimony (number of atoms) in the single silicon crystal 40, the unit being $X\ 10^{18} cm^{-3}$, and the vertical axis is the concentration of oxygen in the single crystal 40, the unit being $X\ 10^{17} cm^{-3}$. And the figure shows the measuring results when the pressure inside the furnace is 30 torr and 60 torr. As shown in FIG. 3, the increase of antimony concentration in the single crystal 40 lowers the concentration of oxygen in the single crystal. And when the pressure inside the furnace 11 increases, the amount of oxygen caught in the single crystal 40 increases. Particularly, the pressure inside the furnace gives higher concentration of oxygen in the single crystal 40 with the increase of concentration of the antimony.

Therefore, heating value of the heater 22, number of revolutions of the crucible 12, rotational speed and pulling up speed of the single crystal 40 by the pulling up unit 30, pressure inside the vacuum vessel 10, and temperature above the molten liquid measured by the temperature sensor 42 are taken as parameters, and relations between these parameters and the amount of evaporation from the molten liquid 24, or relations to the oxygen concentration inside the single crystal 40, are determined in advance through experiments or calculations. And when the single crystal 40 is pulled up from the molten liquid 24, the detected temperature by the temperature sensor 42 is input to the controller 20. The controller 20 watches temperature detected by the temperature sensor 42. When the upper portion of the molten liquid 24 rises, the controller 20 judges that the amount of evaporation of oxygen from the molten liquid 24 is increasing, reduces the amount of evaporation of oxygen from the molten liquid 24 or increases the oxygen concentration just below the growing interface of the single crystal 40 to increase the amount of oxygen caught in the single crystal 40, by reducing the rotational speed of the crucible 12 through increasing the output of the driving motor 18, by increasing the pressure inside the furnace 11 through decreasing the openings of the valve 15, by decreasing the heating value of the heater 22 to lower the temperature of the molten liquid 24 through controlling the transformer 26, and by increasing the rotational speed of the pull up motor 32 to speed up the rotational of the single crystal 40, based on equations and tables given in advance.

For instance, as antimony has a smaller segregation coefficient into a single silicon crystal than that of other dopant by one digit, showing to be hard to enter in the crystal and the vapor pressure of antimony oxide is extremely high and easy to vaporize, addition of antimony to the molten liquid 24 gives a disadvantage of lowering the oxygen concentration in the crystal due to the evaporation of antimony oxide. Therefore antimony is added into the molten liquid 24 after all polycrystalline silicon, the raw material, is melted. But when antimony is added to the molten liquid 24, it reacts with the oxygen dissolved in the molten liquid 24 to yield oxide which vigorously evaporates.

FIG. 4 shows temperatures of the upper portion of the molten liquid 24 detected by the temperature sensor 42, the horizontal axis being an elapsed time in minute after the addition of antimony to the molten liquid 24. Time 0 represents the time when antimony is added to the molten silicon crystal 24. The vertical axis is a detected temperature above the crucible 12 with the temperature sensor 42. As shown in FIG. 4, SiO evaporates from the free surface 44 of the molten liquid 24 and the temperature above the molten liquid 24 is about 120° C. before addition of antimony, but at the same time when antimony is added, plenty of antimony oxide ($Sb_2O$ and the like) in high temperature evaporates accompanied by SiO, and the temperature above the molten liquid 24 rapidly rises. Therefore, as described above, the temperature above the molten liquid 24 is detected by the temperature sensor 42, through which the evaporating oxygen is quantitatively checked, and the amount of oxygen caught in the single crystal 40 can be controlled to a designated value by carrying out the previously described controlling steps to easily obtain the single crystal 40 having a designated oxygen concentration.

When the temperature detected by the temperature sensor 42 is found to be low, the amount of evaporation of oxygen declines, reverse to what described above, and the amount of oxygen caught in the single crystal 40 increases. Therefore the amount of oxygen caught in the single crystal 40 is reduced by lowering the rotational speed of the crucible 12 or the single crystal 40, lowering the pressure inside the furnace 12, increasing the heating value of the heater 22 to increase the amount of oxygen evaporating from the free surface 44 of the molten liquid 24. Incidentally, when the amount of oxygen caught in the single crystal 40 is controlled, more than any two or all of the following factors of the rotational speed of the crucible 12, the rotational speed of the single crystal 40, the heating value of the heater 22, the pressure inside the furnace 11 can be changed according to the amount of evaporation of oxygen. And the surface temperature of the molten liquid 24 can be measured with an infra-red thermometer to detect the figures of evaporation of oxygen.

Thus, by detecting the figures of evaporation of oxygen, the impurity, from the molten liquid 24 with the temperature sensor 42, the amount of the oxygen (oxygen concentration) caught in the single crystal 40 can be obtained, using an equation and the like previously calculated. And by changing more than one of the following factors of the rotational speed of the crucible 12, the rotational speed of the single crystal 40, the heating value of the heater 22, the pressure inside the furnace 11, according to the amount of evaporation of oxygen, the amount of the oxygen caught in the single crystal 40 can be controlled and the oxygen concentration in the single crystal 40 is precisely controlled.

Furthermore, the heat insulator 70, the top heat insulator 72, and the bottom heat insulator 74 are structured in a movable manner and the positions of each heat insulator 70, 72, and 74 (so called H/Z structure) can be moved according to the amount of evaporation of oxygen from the molten liquid 24. For instance, when the amount of evaporation of oxygen from the molten liquid 24 is increased and the amount of oxygen caught in the single silicon crystal 40 is decreased, the heat insulator 70, 72, and 74 are moved so that a temperature difference in the depth direction of the molten liquid 24 becomes big (cold at the top and hot at the bottom) to activate the heat convection of the molten liquid 24 for increasing the amount of oxygen caught in the crystal 40. On the contrary, when the amount of oxygen in the single silicon crystal 40 increases, the heat insulators are shifted to decrease the temperature difference in the depth direction of the molten liquid 24 and restrain the heat convection.

In the MCZ method, the concentration of oxygen caught in the single silicon crystal 40 can be controlled, in addition to the method above described, through changing the strength or the pattern of the magnetic field applied. That is, in the MCZ method, when strength of the magnetic field is increased, the oxygen concentration in the single silicon crystal 40 is, in general, decreased. So, for instance, when the amount of oxygen taken into the single silicon crystal 40 increases, the strength of the magnetic field is raised to lower the oxygen concentration in the single crystal 40, and in order to up the oxygen concentration in the single crystal 40, the strength of the magnetic field is lowered.

Figure 5A:
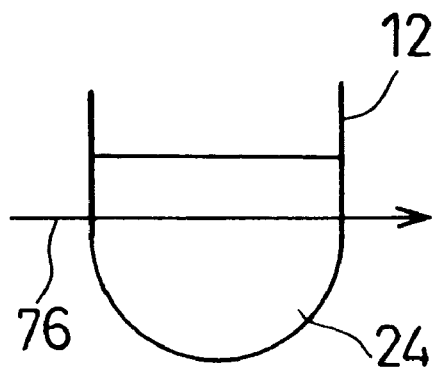
FIGS. 5A–5D are explanatory views of the control method for the oxygen concentration in the single silicon crystal by changing the magnetic field pattern in the MCZ method.
Figure 5B:
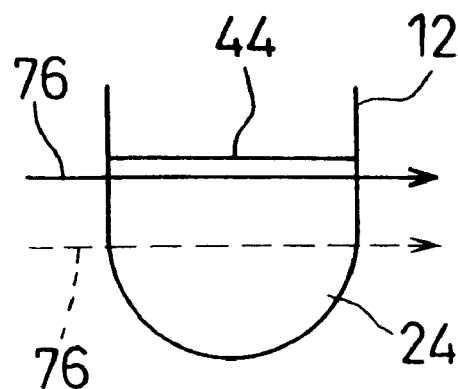
Figure 5C:
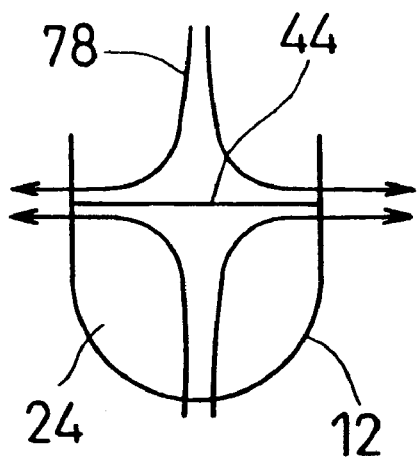
Figure 5D:
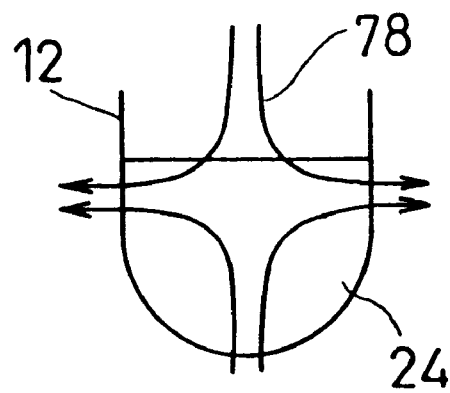

Further, the amount of oxygen caught in the single silicon crystal 40 can be controlled by changing the pattern of the magnetic field applied to the molten liquid 24, for instance, the relative position of the magnetic field to the molten liquid 24. That is, assuming that the magnetic field applied to the molten liquid 24 is a transverse (horizontal) magnetic field 76 as shown in FIG. 5A, when the oxygen concentration in the single silicon crystal 40 is required to lower, the transverse magnetic field 76 is placed near the molten liquid 24 as shown in FIG. 5B, while the oxygen concentration in the single crystal needs to be increased, the transverse magnetic field 76 is placed deep in the molten liquid 24 as shown by a broken line. Similarly, when the magnetic field is a cusped magnetic field 78 having a magnetic boundary at the free surface 44 of the molten liquid 24 as shown in FIG. 5C, lowering of the oxygen concentration in the single crystal 40 is carried out by placing the boundary of the magnetic field below the free surface 44 as shown in FIG. 5D and increasing of the oxygen concentration in the single crystal is by placing the boundary of the magnetic field above the free surface 44.

Figure 6:
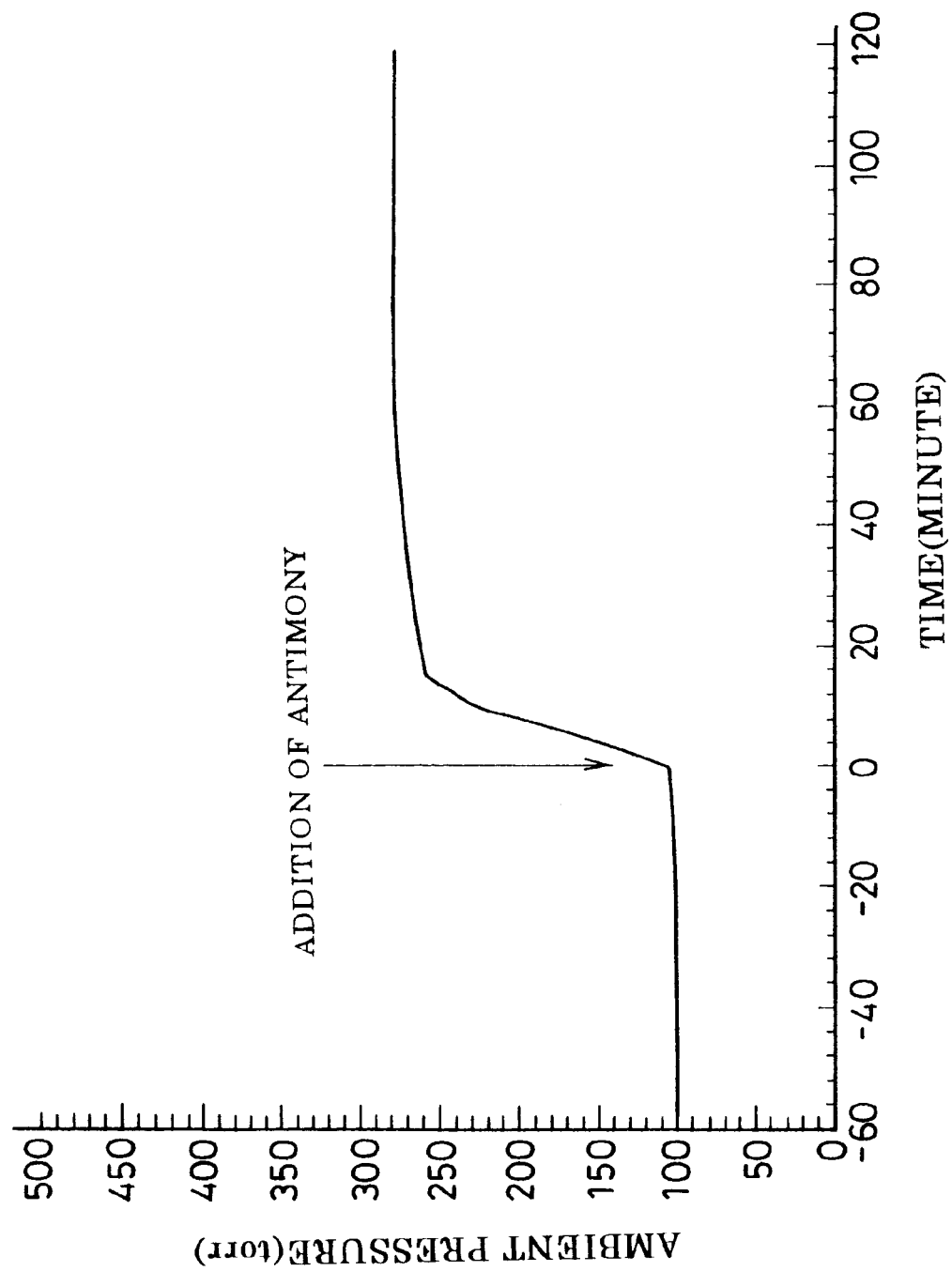
FIG. 6 is a view showing the pressure change inside the furnace when antimony is added to the molten silicon liquid.

By the way, antimony rapidly evaporates as oxide when added to the molten liquid 24 of silicon as described before, raises the pressure inside the furnace 11. The horizontal axis in FIG. 6 expresses an elapsed time in minute after antimony is added as in FIG. 4, time 0 being that of the antimony addition. The vertical axis expresses the pressure inside the furnace 11 in torr. As shown in FIG. 6, the pressure inside the furnace 11 is about 100 torr before addition of antimony, but rapidly rises by the evaporation of its oxide when adding of antimony. Therefore, the oxygen concentration in the single crystal 40 needs to be controlled by detecting the pressure inside the furnace 11 as shown in a second embodiment in FIG. 7.

Figure 7:
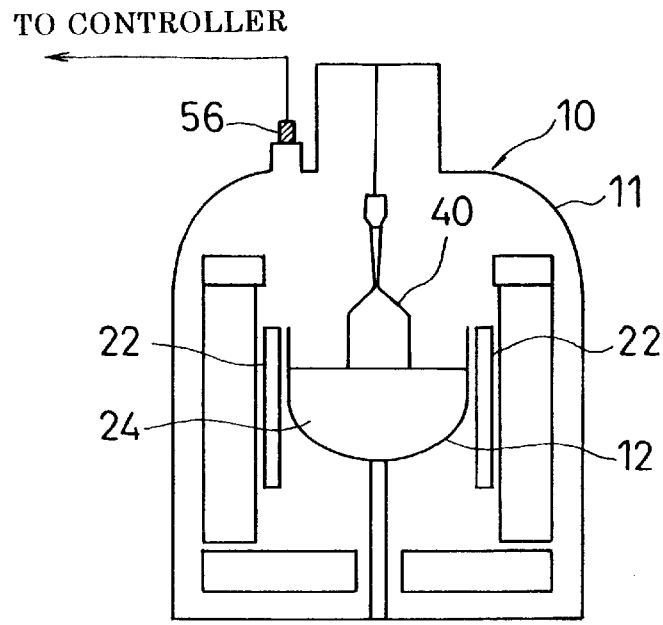
FIG. 7 is an explanatory view of the main parts of a pull up apparatus for the single crystal relating to a second embodiment of the present invention.

In the embodiment, a pressure sensor 56 is provided as an evaporation detector which detects the pressure inside the furnace 11, which is to input to the controller 20 not shown in FIG. 7 as a detected signal of the oxygen in proceeding of evaporation. Thus, antimony is cast into the crucible 12, its oxide vigorously evaporates and raises the pressure inside the furnace 11. The pressure sensor 56 detects the rise and inputs the information to the controller 20. There, the controller 20 concedes from the detected data of the pressure sensor 56 that the amount of oxygen evaporation is increasing and reduces the amount of evaporation of oxygen through the process described before. The controls of oxygen concentration and antimony concentration in the single crystal 40 are carried out in a like manner in a case of no addition of antimony.

Figure 8:
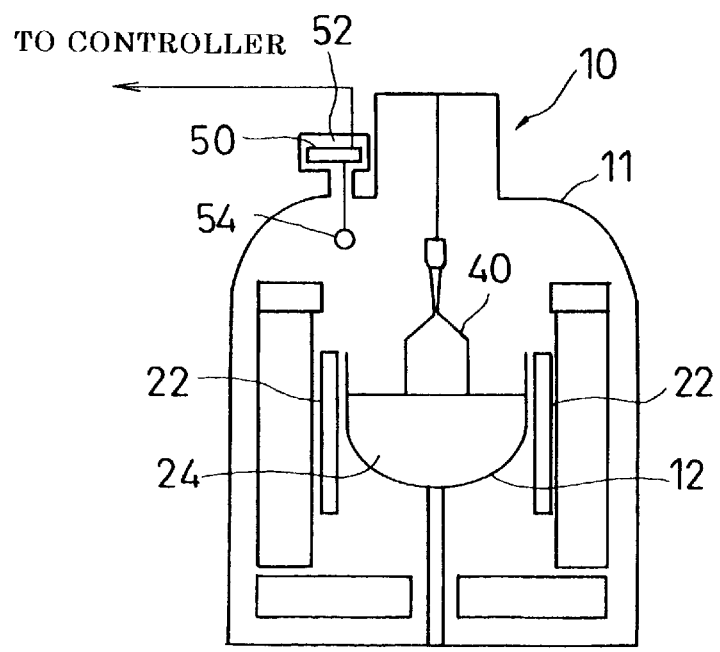
FIG. 8 is an explanatory view of the main parts of a pull up apparatus for the single crystal relating to a fifth embodiment of the present invention.

FIG. 8 is an explanatory view of main parts of a third embodiment. In the embodiment, a precision balance 50 is used as an evaporating sensor detecting an evaporation state of oxygen. The precision balance 50 is placed in a storage room 52 arranged above the furnace 11, being protected not to be affected by vaporized substances from the crucible 12, and sending inputs of measured data to the controller 20 not shown in FIG. 8. The precision balance 50 has also a detecting piece 54 placed in the furnace 11 so that vaporized substances from the crucible 12 can be condensed on the detecting piece 54. Incidentally, the detecting piece 54 is preferably kept in a temperature at which condencing evaporated substances (such as SiO, $Sb_2O$ and so on) are apt to condense.

In the third embodiment thus constructed, the controller 20 reads the output signal of the precision balance 50 at regular time intervals, weighs the condensed amount of the evaporated substance from the crucible 12 on the detecting piece 54 per unit of time, and detects oxygen in evaporating. The controller 20 checks the amount of evaporation from the whole molten liquid 24 based on the output data from the precision balance 50. And the controller 20 reduces the amount of oxygen in evaporation in a like manner as before described and increases the amount of oxygen taken into the single crystal 40 when the amount per unit time of condensation on the detecting piece 54 increases to invite a rise of the amount of oxygen in evaporation.

Incidentally, in each embodiment above described, the temperature sensor 42, the precision balance 50, and the pressure sensor 56 are explained as provided alone, any two of these can be used in combination or can be provided by all of them in one embodiment. Or, the gas inside the furnace may be sent to a gas analyzer to obtain the kind of evaporates and the amount of the evaporation. And in the previous embodiment, the case of controlling the oxygen concentration in the single silicon crystal 40 is explained, but the method can be applied to control the concentration of dopant which controls electrical resistance (or electric conductivity) of the single crystal 40.

When single silicon crystal 40 is produced to obtain a n-type silicon wafer or p-type silicon wafer, a dopant such as phosphorus (P), arsenic (As) and antimony (Sb) which are for making the single crystal into a n-type one, and boron (B) to make the single crystal into a p-type one is added to the molten liquid 24 and the pull-up of the single crystal 40 is carried out. As the concentration of the dopants in the single crystal 40 greatly affects the electrical resistance of the single crystal 40, the concentration needs to be precisely controlled. Therefore, applying each embodiment above described, the amount of evaporation of dopant is adjusted to control the concentration of dopant in the single crystal 40. For instance, it can be applied to a continuous pull-up of the single crystal by the CZ method.

Figure 9:
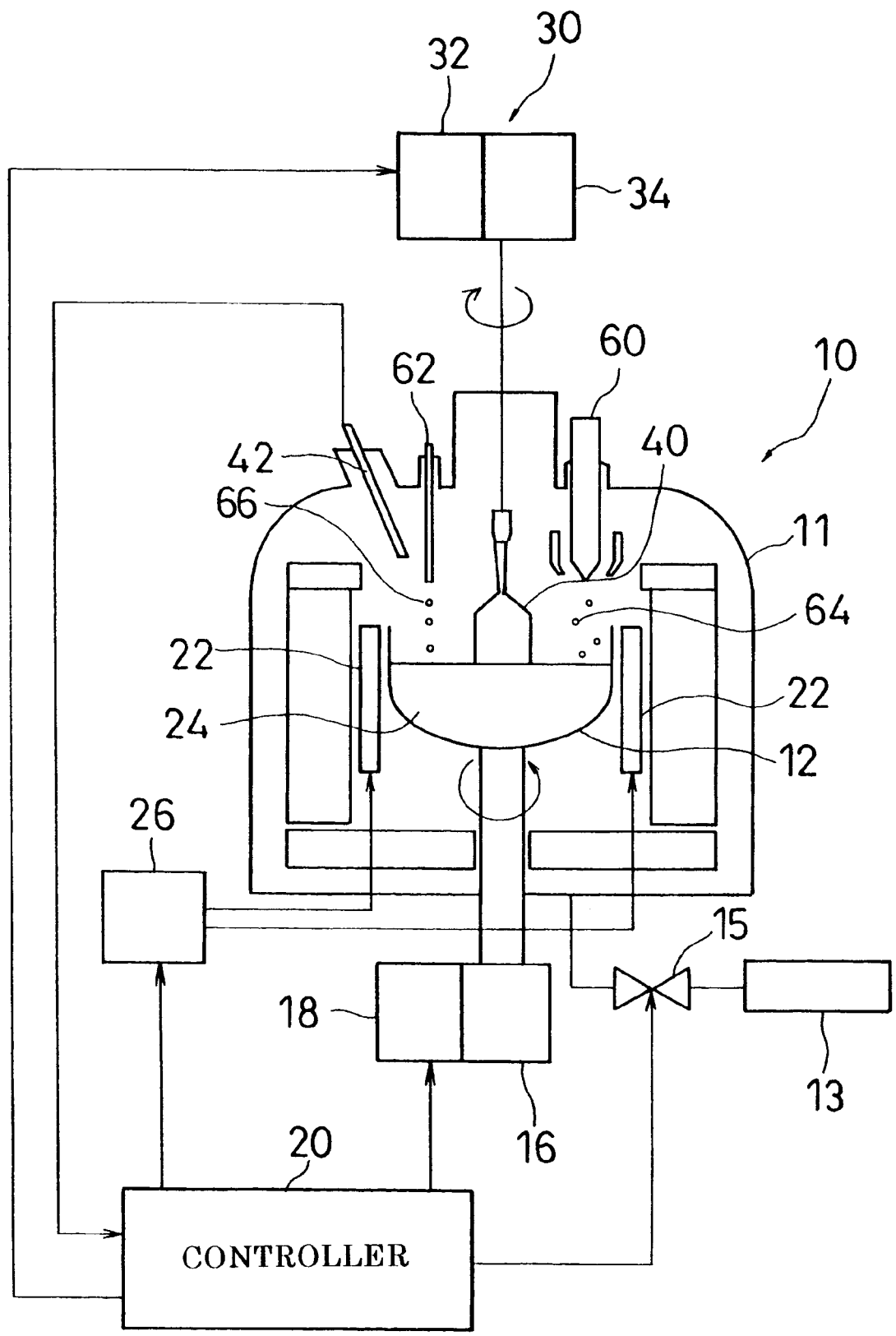
FIG. 9 is an explanatory view of the continuous pull up apparatus for the single crystal relating to an embodiment.

As the continuous pull-up of the single crystal 40 is carried out while supplying polycrystal as a raw material to the crucible 12, it has advantages of obtaining not only a long single crystal, but a single crystal having a uniform oxygen concentration in the axial direction of the single crystal 40 by maintaining the level of the molten liquid 24 to the crucible 12 constant to make the contact area of the molten liquid 24 with the crucible 12 invariable. But the single crystal 40 is pulled up while the polycrystal silicon is being supplied, dopant is required to add during the pull-up work to compensate the lowered dopant concentration in the molten liquid 24. FIG. 9 shows a single crystal pulling up apparatus to allow the continuous pulling up for the single crystal by the CZ method.

In FIG. 9, the furnace 11 of the pulling up apparatus 10 is provided with a raw material supply equipment 60 and a dopant supply equipment 62 to supply single silicon crystal 64, a raw material, to the crucible 12 and dopant 66 such as antimony and the like, whenever necessary. Other configurations are the same as those in FIG. 1.

When the single crystal 40 is continuously pulled up, polycrystal silicon 64 and dopant 66 are supplied to the crucible 12 while the single crystal 40 is being pulled up as described before. But the moment when dopant 66 is added to the molten liquid 24, oxide of dopant 66 may vigorously vaporize. Therefore, the temperature above the molten liquid 24 is checked with the temperature sensor 42, and the vaporization of the dopant oxide is controlled by increasing the rotational speed of the crucible 12, building up the pressure inside the furnace 11, and lowering the heating value of the heater 22 in a like manner as before, when the temperature increase is found. With these actions, the amount of dopant 66 taken into the single crystal 40 can be controlled in a fixed quantity and the single crystal 40 with a desired resistance can be obtained.

Incidentally, in the embodiments described before, the pull-up of single silicon crystal 40 is explained, the method can be applied to the horizontal Bridgman method and the liquid seal pulling up method to produce a single crystal of gallium arsenide (GaAs).

What is claimed is:

1. A detecting method for concentration of impurity in a crystal, said detecting method comprising the steps of:

detecting said impurity in evaporating from a molten liquid placed inside a furnace; and obtaining said concentration of the impurity in the crystal formed from said molten liquid.

2. The detecting method for concentration of impurity in a crystal according to claim 1, wherein the detecting of said impurity in evaporation is to detect at least any one of the following items of amount of said impurity, the temperature above said molten liquid or the pressure inside of said furnace.

3. The detecting method for concentration of impurity in a crystal according to claim 1, wherein said crystal is a single semiconductor crystal and said impurity is oxygen.

4. The detecting method for concentration of impurity in a crystal according to claim 1, wherein said crystal is a single semiconductor crystal; and wherein said impurity is a dopant to control electrical resistance of said single semiconductor crystal.

5. A method for producing a single crystal in which a single crystal is pulled up from a molten liquid in a crucible placed in a furnace while growing, said method for producing a single crystal comprising the steps of:

detecting said impurity in progress of evaporation from said molten liquid; and changing at least any one of heating value of a heater, the number of revolutions of said crucible, the number of revolutions of said single crystal, H/Z structure or inside pressure of said furnace, according to said impurity in progress of evaporation.

6. The method for producing a single crystal according to claim 5, wherein the detection of said impurity in the progress of evaporation is to measure at least any one of the following items of the amount of evaporation of said impurity, the temperature above said molten liquid, or the pressure inside of said furnace.

7. The method for producing a single crystal according to claim 5, wherein said single crystal is a single semiconductor crystal; and wherein said impurity is oxygen.

8. The method for producing a single crystal according to claim 5, wherein said single crystal is a single semiconductor crystal; and wherein said impurity is a dopant which controls electrical resistance of said single semiconductor crystal.

9. A method for producing a single crystal in which a single crystal is pulled up from a molten liquid to which a magnetic field being applied in a crucible placed in a furnace while growing, said method for producing a single crystal comprising the steps of:

detecting said impurity in progress of evaporation from said molten liquid; and changing at least any one of heating value of a heater, the number of revolutions of said crucible, the number of revolutions of said single crystal, H/Z structure, inside pressure of said furnace, or a pattern or strength of said magnetic field, according to said impurity in evaporating.

* * * * *